United States Patent
Bedarida et al.

(10) Patent No.: US 7,499,334 B2
(45) Date of Patent: *Mar. 3, 2009

(54) METHOD AND APPARATUS FOR DISCHARGING A MEMORY CELL IN A MEMORY DEVICE AFTER AN ERASE OPERATION

(75) Inventors: Lorenzo Bedarida, Milan (IT); Simone Bartoli, Cambiago (IT); Giorgio Oddone, Genoa (IT); Davide Manfre', Bologna (IT)

(73) Assignee: Atmel Corporation, San Jose, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 11/583,625

(22) Filed: Oct. 18, 2006

(65) Prior Publication Data

US 2007/0047325 A1  Mar. 1, 2007

Related U.S. Application Data

(63) Continuation of application No. 11/123,979, filed on May 6, 2005, now Pat. No. 7,177,198.

(30) Foreign Application Priority Data

Sep. 21, 2004  (IT) .......................... MI2004A1802

(51) Int. Cl.
 *G11C 11/34* (2006.01)

(52) U.S. Cl. .............................. 365/185.25; 365/185.29

(58) Field of Classification Search ............ 365/185.25, 365/185.29, 185.27, 185.26
See application file for complete search history.

(56) References Cited

U.S. PATENT DOCUMENTS

| 4,363,109 | A | 12/1982 | Gardner |
| 5,552,621 | A | 9/1996 | Kowalski |
| 5,608,684 | A | 3/1997 | Reasoner et al. |
| 5,721,440 | A | 2/1998 | Kowalski |
| 6,198,662 | B1 | 3/2001 | Chen et al. |
| 6,219,281 | B1 | 4/2001 | Chen et al. |
| 6,335,879 | B1 | 1/2002 | Matsubara et al. |
| 6,438,032 | B1 * | 8/2002 | Pekny et al. ........... 365/185.18 |
| 6,751,118 | B2 | 6/2004 | Tran et al. |
| 7,177,198 | B2 | 2/2007 | Bedarida |

FOREIGN PATENT DOCUMENTS

WO   WO-06033832 A2   3/2006

* cited by examiner

*Primary Examiner*—Anh Phung
(74) *Attorney, Agent, or Firm*—Schwegman, Lundberg & Woessner, P.A.

(57) ABSTRACT

A method and apparatus for discharging a memory cell in a memory device. In one implementation, the memory cell includes a capacitor having a first plate and a second plate, and the method includes initially discharging the first plate of the capacitor through a first discharge circuit and discharging the second plate of the capacitor through a second discharge circuit. After the initial discharge, the method further includes completely discharging the first plate of the capacitor and the second plate of the capacitor by coupling both the first plate of the capacitor and the second plate of the capacitor to ground.

22 Claims, 4 Drawing Sheets

METHOD AND APPARATUS FOR DISCHARGING A MEMORY CELL IN A MEMORY DEVICE AFTER AN ERASE OPERATION

CROSS-REFERENCE TO RELATED APPLICATIONS

This application is a continuation of application Ser. No. 11/123,979, filed May 6, 2005, now U.S. Pat. No. 7,177,198, which issued on Feb. 13, 2007, and claims the benefit under 35 U.S.C. §119 of Italian Application No. MI2004A 001802, filed Sep. 21, 2004.

FIELD OF THE INVENTION

The present invention relates to memory devices, and more particularly to discharge of a memory cell in a memory device after an erase operation.

BACKGROUND OF THE INVENTION

It is desirable for memory flash devices, e.g., with NOR-architecture, to be able to complete the erase operations with sufficiently fast timing. Normally, these devices use the Fowler-Nordheim Tunneling to perform the erase operations. With this methodology, high voltages are applied contemporaneously to the memory cells to be erased. The erase operation then completes by discharging these high voltages to ground. However, there is a trade-off between the speed and the reliability of the erase operation. To obtain a proper balance between the two, voltages in the order of 7 to 9V for the positive voltage, and −8 to −10V for the negative voltage, are typically used. Two techniques are available for the positive voltage: a positive voltage is applied only to the bulk node; or a positive voltage is applied to the bulk node and to the source node of the memory cells. In this specification, only the second method is analyzed but either technique can be applied.

FIG. 1 illustrates a simplified physical and electrical model to represent the conventional erase phases performed on a sector of a memory device. The electrical model is composed of three capacitors: Cggnd 101, Cgb 102, and Cbgnd 103. Cgb 102 represents the gate-bulk capacitor, which has a capacitance equal to the total gate capacitance of the sector to be erased versus the common cell bulk-source node. The top plate of Cgb 102 represents the common gate node 104, and the bottom plate represents the bulk-source node 105. Cggnd 101 represents the capacitance of the gate node 104 versus all other nodes except the bulk-source node 105 (Node 1), and Cbgnd 103 represents the capacitance of the bulk-source node 105 versus all other nodes except the gate node 104 (Node 2). Fowler-Nordheim Tunneling erase is performed by applying a negative voltage on the gate node 104 and a positive voltage on the bulk-source node 105. With the voltages above, the total voltage seen by Cgb 102 is in the order of approximately 20V.

Since the capacitance value of all gates is relatively high, by capacitive coupling, the gate node 104 (starting from −8/−10V) can reach a high negative voltage during bulk-source discharge. Moreover, the bulk-source node 105 can reach a high positive voltage during gate discharge in the same way. This value is very dangerous for all internal MOS devices which can tolerate, normally, a voltage difference no higher than 11V. After 11V, serious reliability problems occur. Thus, it's very important to control these discharge phases after the erase operations with special circuitry to anticipate reliability problems.

FIG. 2 illustrates one conventional approach for preventing reliability problems caused by reached voltage exiting from erase operations. Here, the top plate and bottom plate of Cgb 202 are coupled together via the initial discharge circuit 204 before discharging the gate node 104 and the bulk-source node 105 to ground. FIG. 2 also includes a digital control circuit 205 that completes the discharge operation by connecting to ground the gate node 104 and the bulk-source node 105. The discharge operation is controlled because the gate node voltage variation cannot be lower than the initial voltage, and the bulk-source voltage variation cannot be higher than the initial voltage. For example, if Cggnd=Cbgnd and the start absolute voltage is the same for the gate node 104 and the bulk-source node 105, the Cgb plates will be discharged to the same value of zero.

In the case with Cggnd>>>Cbgnd or Cggnd<<<Cbgnd, the node with a bigger capacitance versus all other nodes will tend to keep the initial voltage value while the other voltage node will decrease its value quickly. The positive and negative voltages will have their absolute values reduced without dangerous drop or overshoot. The gate and source/bulk voltages will go to ground without dangerous oscillations.

However, with this approach, the initial discharge circuit 204 is required to work between −8/−10V (gate voltage) and 7/9V (bulk-source voltage). This requires a complicated design, where voltage limiters may be necessary in order for the circuit to properly operate with initial voltages near 20V.

BRIEF SUMMARY OF THE INVENTION

In general, in one aspect, this specification describes a method for discharge in a memory device. The method includes initiating a discharge of a memory cell after an erase operation, and coupling a first discharge circuit to a first plate of a first capacitor, and a second discharge circuit to a second plate of the first capacitor. The first plate represents a common gate node of the memory cell and the second plate represents a bulk-source node of the memory cell versus ground. The method further includes coupling the common gate node and the bulk-source node to ground to provide for a discharge.

Particular implementations can include one or more of the following features. A current injected into the first plate can be approximately equal to a current extracted from the second plate. The first capacitor can be a gate-bulk capacitor. The first plate of the gate-bulk capacitor can be coupled to a second capacitor representing a capacitance of a gate node of the memory cell versus all other nodes except the bulk-source node. The second plate of the gate-bulk capacitor can be coupled to a third capacitor representing a capacitance of the bulk-source node versus all other nodes except a gate node. The memory device can be a flash memory device.

In general, in another aspect this specification describes a method for discharging a memory cell in a memory device, in which the memory cell includes a capacitor having a first plate and a second plate. The method includes initially discharging the first plate of the capacitor through a first discharge circuit and discharging the second plate of the capacitor through a second discharge circuit. After the initial discharge, the method further includes completely discharging the first plate of the capacitor and the second plate of the capacitor by coupling both the first plate of the capacitor and the second plate of the capacitor to ground.

Particular implementations can include one or more of the following features. The first discharge circuit can have a first node operable to be connected to the first plate and a second node connected to ground. The second discharge circuit can have a first node operable to be connected to the second plate and a second node connected to ground. Discharging the first plate of the capacitor through a first discharge circuit and discharging the second plate of the capacitor through a second discharge circuit can include injecting a current into the first plate of the capacitor that is approximately equal to current extracted from the second plate of the capacitor. The memory cell in the memory device can be discharged after an erase operation in the memory cell.

In general, in another aspect this specification describes a memory device including a memory cell including a capacitor having a first plate and a second plate, a first discharge circuit having a first node to be connected to the first plate and a second node connected to ground, and a second discharge circuit having a first node to be connected to the second plate and a second node connected to ground. The memory device further includes a control circuit to discharge the capacitor after an erase operation of the memory cell by initially discharging the first plate of the capacitor through the first discharge circuit by coupling the first node of the first discharge circuit to the first plate, and discharging the second plate of the capacitor through the second discharge circuit by coupling the first node of the second discharge circuit to the first plate. After the initial discharge, the control circuit completely discharges the first plate of the capacitor and the second plate of the capacitor by coupling both the first plate of the capacitor and the second plate of the capacitor to ground.

Particular implementations can include one or more of the following features. During the initial discharge, the first discharge circuit and the second discharge circuit can keep current injected into the first plate approximately equal to current extracted from the second plate. The capacitor can be a gate-bulk capacitor and the first plate can represent a common gate node of the memory cell and the second plate can represent a bulk-source node of the memory cell.

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

The present invention provides an improved method for discharging a memory cell in a memory device after an erase operation. The following description is presented to enable one of ordinary skill in the art to make and use the invention and is provided in the context of a patent application and its requirements. Thus, the present invention is not intended to be limited to the embodiment shown but is to be accorded the widest scope consistent with the principles and features described herein.

To more particularly describe the features of the present invention, please refer to FIGS. 3 and 4 in conjunction with the discussion below.

Figure 1:
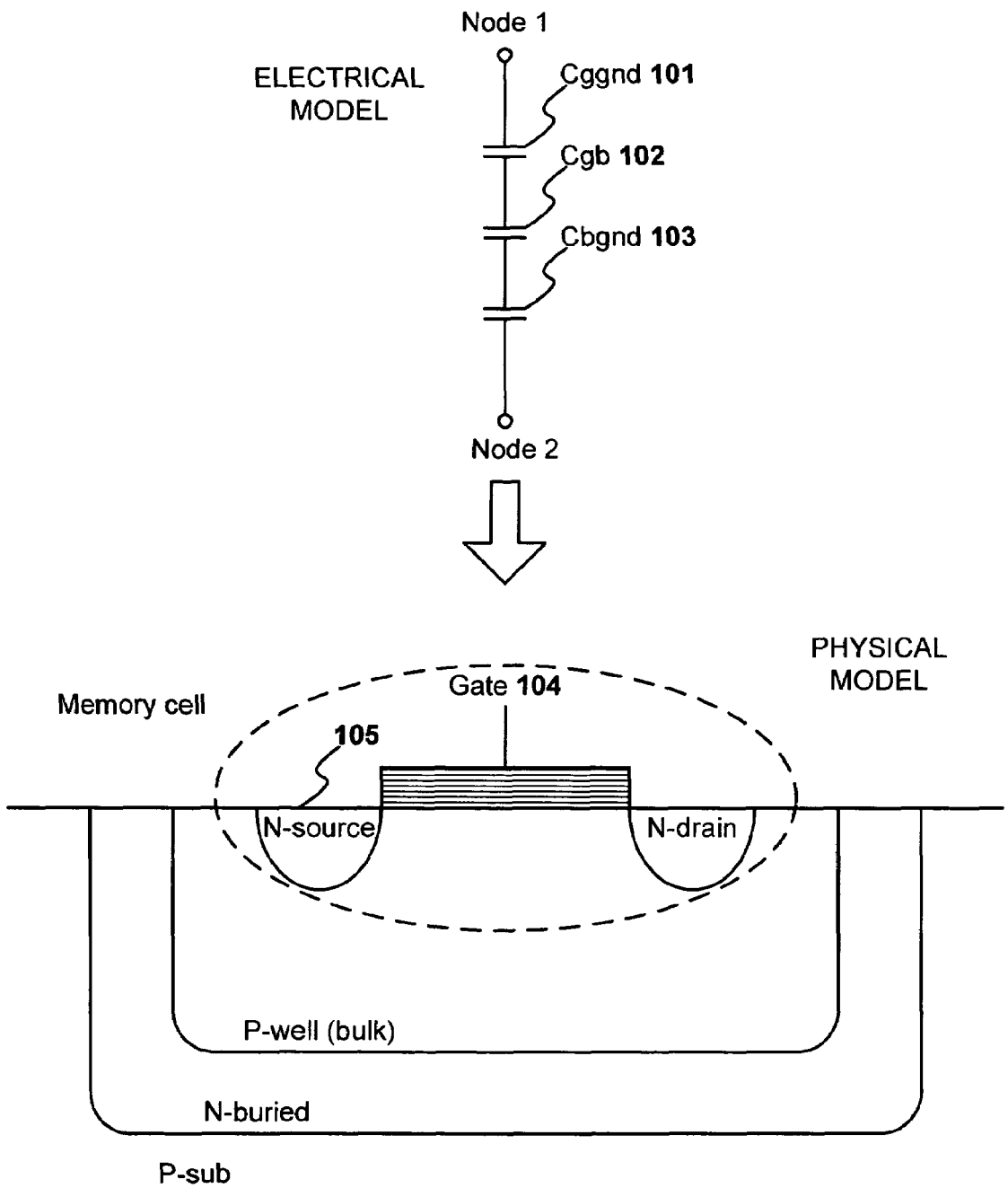
FIG. 1 illustrates a simplified physical and electrical model to represent the conventional erase phases performed on a sector of a memory device.
Figure 2:
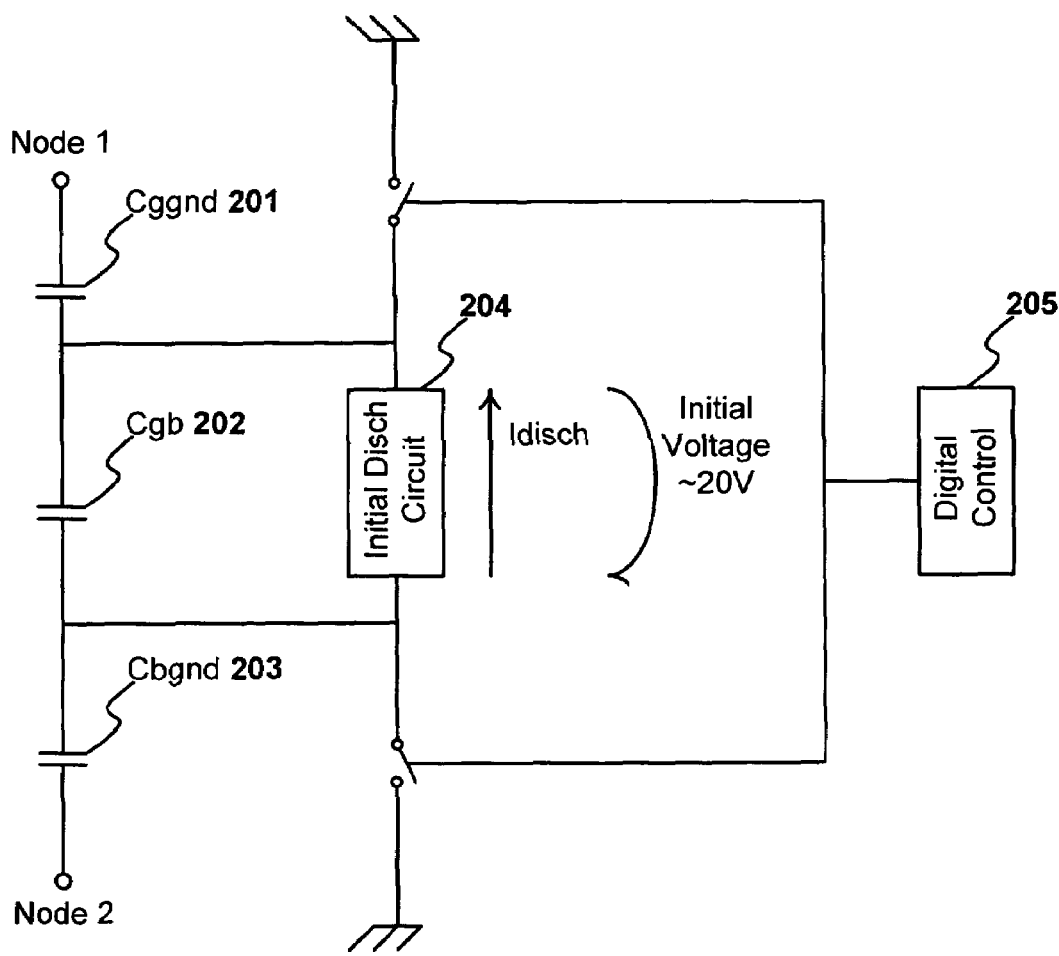
FIG. 2 illustrates one conventional approach for preventing reliability problems caused by reached voltage exiting from erase operations.
Figure 3:
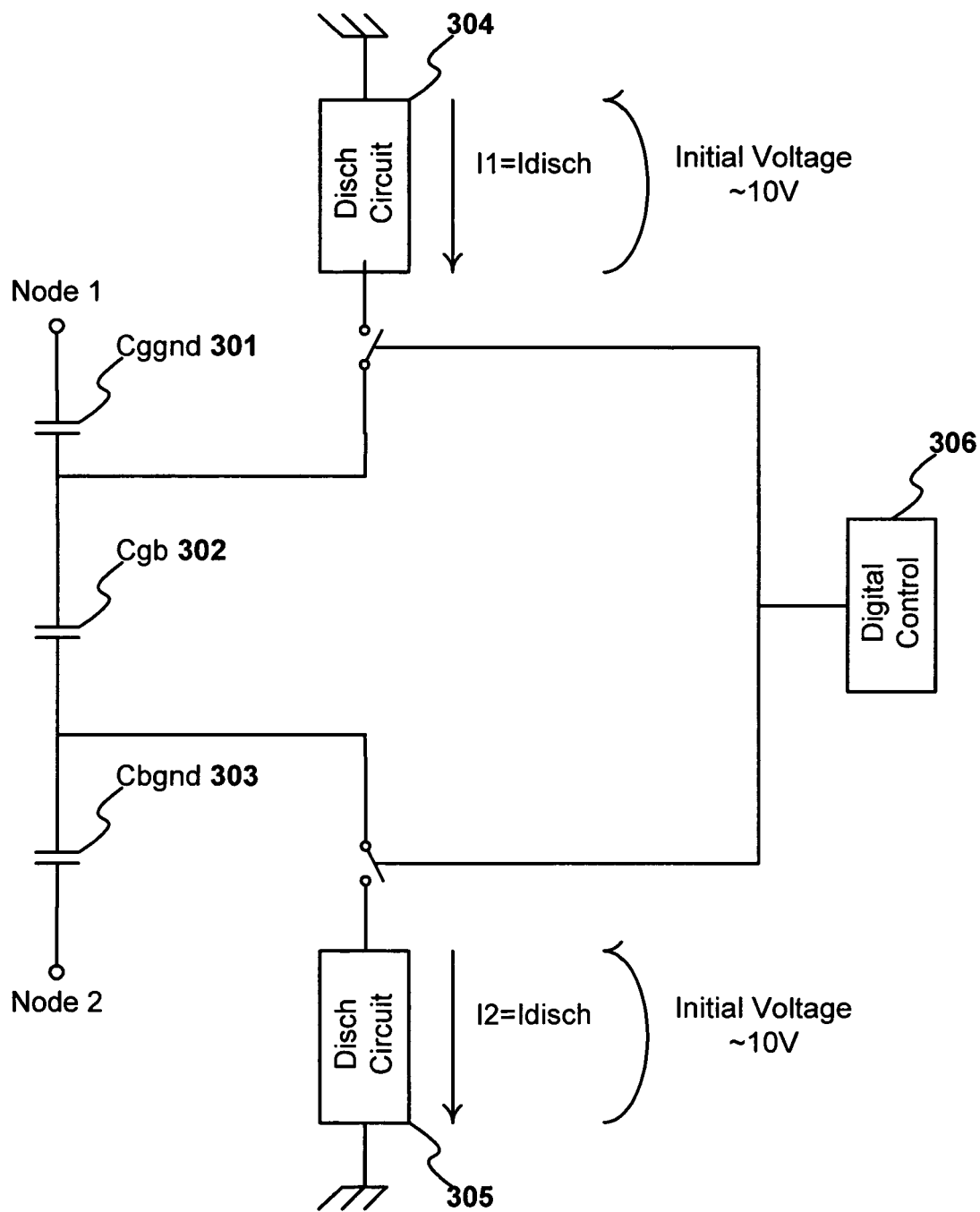
FIG. 3 illustrates an electrical model of a discharge circuit in accordance with one embodiment the present invention.
Figure 4:
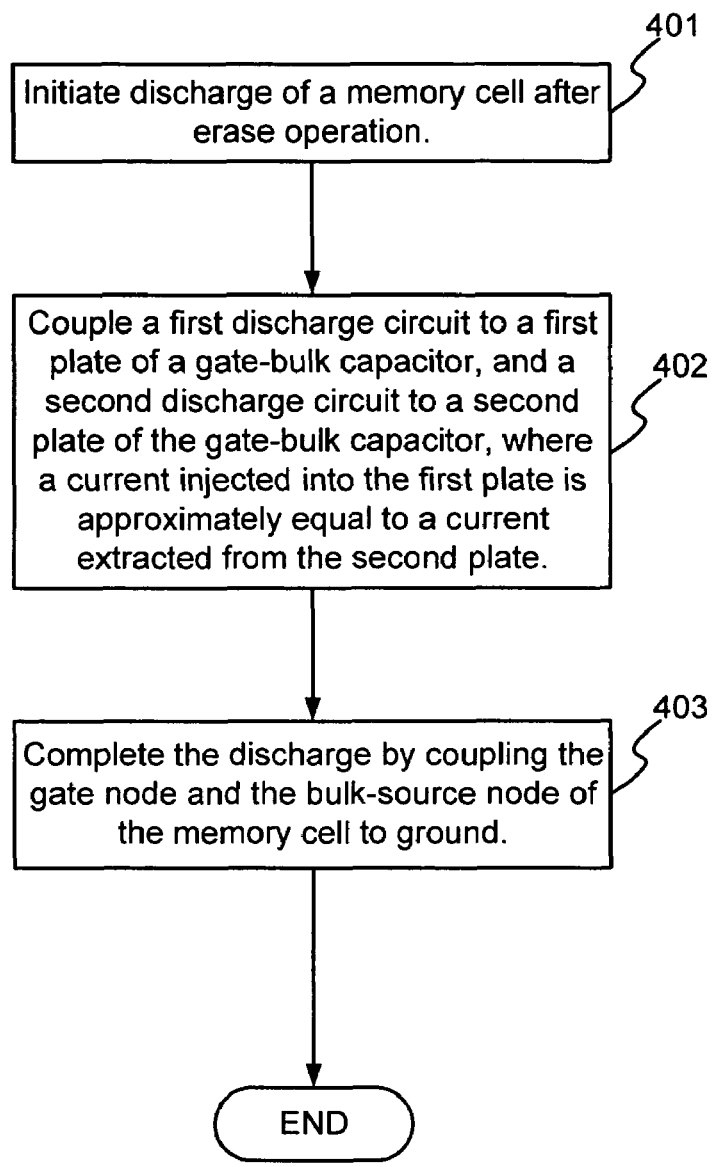
FIG. 4 illustrates a method for a high voltage discharge phase after an erase operation in a memory device in accordance with one embodiment the present invention.

FIGS. 3 and 4 illustrate an electrical model and a flowchart, respectively, of a method for a high voltage discharge phase after an erase operation in a memory device in accordance with one embodiment the present invention. The electrical model is composed of three capacitors: Cggnd 301, Cgb 302, and Cbgnd 303. Cgb 302 represents the gate-bulk capacitor, Cggnd 301 represents the capacitance of the gate node 104 versus Node 1, and Cbgnd 303 represents the capacitance of the bulk-source node versus Node 2. The top plate of Cgb 302 represents the common gate node, and the bottom plate represents the bulk-source node.

Referring to both FIGS. 3 and 4, when the discharge of a memory cell is initiated, via step 401, the discharge circuits 304-305 are coupled to the first (top) and second (bottom) plates of Cgb 302, respectively, via step 402. The discharge circuits 304-305 keep the current injected into the top plate of Cgb 302 approximately equal to the current extracted from the bottom plate (I1=I2). Thus, when voltage in the order of 7V to 9V for the positive voltage, and −8V to −10V for the negative voltage are used in the erase operation, the maximum absolute voltage seen by the gate discharge circuit 304 for the gate discharger is approximately 8V-10V, and the absolute voltage seen by the bulk-source discharge circuit 305 is approximately 7V-9V. After this initial discharge, the digital control circuit 306 completes the discharge operation by coupling the gate node and the bulk-source node to ground, via step 403. Neither complicated designs nor voltage limiters are required to keep the discharge circuits 304-305 operating at these appropriate initial voltages. As shown in FIG. 3, in one embodiment, the discharge circuit 304 is separate from the discharge circuit 305.

An improved method for high voltage discharge phase after an erase pulse in a flash memory device has been disclosed. The method couples discharge circuits to the top and bottom plates of the gate-bulk capacitor during the initial discharge of a memory cell, such that the current injected into the top plate approximately equals the current extracted from the bottom plate. In this manner, dangerous oscillations of the gate and bulk-source voltages as they go to ground without complicated designs or voltage limiters, and without sacrificing the fast discharge after the erase operation. The reliability of the discharge operation is thus significantly improved.

To further minimize drop or overshoot, it is possible to use a matrix N-buried big capacitance (versus ground) to load the bulk-source node. If during the discharge phases, the bulk-source node and the N-buried node are connected together, and discharged together, possible oscillations on these nodes are automatically reduced because their capacitance to ground is increased. Then, it is possible to simplify the design of the discharge circuits 304-305 (see FIG. 3) because a little difference between I1 and I2 would be acceptable.

Although the present invention has been described in accordance with the embodiments shown, one of ordinary skill in the art will readily recognize that there could be variations to the embodiments and those variations would be within the scope of the present invention. Accordingly, many modifications may be made by one of ordinary skill in the art without departing from the scope of the appended claims.

What is claimed is:

1. A method for discharge in a memory device, the method comprising:

initiating a discharge of a memory cell after an erase operation;

coupling a first discharge circuit to a first plate of a first capacitor, and a second discharge circuit to a second plate of the first capacitor, wherein the first plate represents a common gate node of the memory cell and the second plate represents a bulk-source node of the memory cell versus ground; and coupling the common gate node and the bulk-source node to ground to provide for a discharge.

2. The method of claim 1, wherein a current injected into the first plate is approximately equal to a current extracted from the second plate.

3. The method of claim 1, wherein the first capacitor is a gate-bulk capacitor.

4. The method of claim 3, wherein the first plate of the gate-bulk capacitor is coupled to a second capacitor representing a capacitance of a gate node of the memory cell versus all other nodes except the bulk-source node.

5. The method of claim 4, wherein the second plate of the gate-bulk capacitor is coupled to a third capacitor representing a capacitance of the bulk-source node versus all other nodes except a gate node.

6. The method of claim 1, wherein the memory device is a flash memory device.

7. A method for discharging a memory cell in a memory device, the memory cell including a capacitor having a first plate and a second plate, the method comprising:

initially discharging the first plate of the capacitor through a first discharge circuit and discharging the second plate of the capacitor through a second discharge circuit, the first discharge circuit being separate from the second discharge circuit; and after the initial discharge, completely discharging the first plate of the capacitor and the second plate of the capacitor by coupling both the first plate of the capacitor and the second plate of the capacitor to ground.

8. The method of claim 7, wherein the first discharge circuit has a first node operable to be connected to the first plate and a second node connected to ground, the second discharge circuit has a first node operable to be connected to the second plate and a second node connected to ground.

9. The method of claim 8, wherein discharging the first plate of the capacitor through a first discharge circuit and discharging the second plate of the capacitor through a second discharge circuit includes injecting a current into the first plate of the capacitor that is approximately equal to current extracted from the second plate of the capacitor.

10. The method of claim 8, wherein the memory cell in the memory device is discharged after an erase operation in the memory cell.

11. The method of claim 10, wherein the erase operation of the memory cell is performed using Fowler-Nordheim tunneling.

12. The method of claim 8, wherein the capacitor is a gate-bulk capacitor and the first plate represents a common gate node of the memory cell and the second plate represents a bulk-source node of the memory cell.

13. The method of claim 8, wherein the memory device is a flash memory device.

14. A memory device comprising:
a memory cell including a capacitor having a first plate and a second plate;
a first discharge circuit having a first node to be connected to the first plate and a second node connected to ground;
a second discharge circuit having a first node to be connected to the second plate and a second node connected to ground; and
a control circuit to discharge the capacitor after an erase operation of the memory cell by
initially discharging the first plate of the capacitor through the first discharge circuit by coupling the first node of the first discharge circuit to the first plate, and discharging the second plate of the capacitor through the second discharge circuit by coupling the first node of the second discharge circuit to the first plate; and
after the initial discharge, the control circuit to completely discharge the first plate of the capacitor and the second plate of the capacitor by coupling both the first plate of the capacitor and the second plate of the capacitor to ground.

15. The memory device of claim 14, wherein during the initial discharge the first discharge circuit and the second discharge circuit keep current injected into the first plate approximately equal to current extracted from the second plate.

16. The memory device of claim 14, wherein the erase operation of the memory cell is performed using Fowler-Nordheim tunneling.

17. The memory device of claim 14, wherein the capacitor is a gate-bulk capacitor and the first plate represents a common gate node of the memory cell and the second plate represents a bulk-source node of the memory cell.

18. The memory device of claim 17, wherein the memory device is a flash memory device.

19. A memory device discharge method, comprising:
initiating a discharge of a memory cell after an erase operation including discharging a first plate of a capacitor through a first discharge circuit and discharging a second plate of the capacitor through a second discharge circuit different than the first discharge circuit, wherein the first plate represents a common gate node of the memory cell and the second plate represents a bulk-source node of the memory cell versus ground; and
coupling the common gate node and the bulk-source node to ground to provide for a further discharge.

20. The method of claim 19, wherein initiating a discharge of a memory cell comprises injecting a current into the first plate of the capacitor that is approximately equal to a current extracted from the second plate of the capacitor.

21. The method of claim 19, wherein initiating a discharge of a memory cell comprises implementing the erase operation using Fowler-Nordheim tunneling.

22. The method of claim 19, comprising providing a flash memory device that includes at least one memory cell.

* * * * *